United States Patent
Miyoshi (10) Patent No.: US 9,960,342 B2
(45) Date of Patent: May 1, 2018

(54) PIEZOELECTRIC POLYMER COMPOSITE MATERIAL

(71) Applicant: FUJIFILM Corporation, Tokyo (JP)

(72) Inventor: Tetsu Miyoshi, Ashigara-kami-gun (JP)

(73) Assignee: FUJIFILM Corporation, Tokyo (JP)

( * ) Notice: Subject to any disclaimer, the term of this patent is extended or adjusted under 35 U.S.C. 154(b) by 177 days.

(21) Appl. No.: 14/867,784

(22) Filed: Sep. 28, 2015

(65) Prior Publication Data

US 2016/0020380 A1  Jan. 21, 2016

Related U.S. Application Data

(63) Continuation of application No. PCT/JP2014/059350, filed on Mar. 28, 2014.

(30) Foreign Application Priority Data

Mar. 29, 2013 (JP) ................................. 2013-075123

(51) Int. Cl.
| | |
|---|---|
| *H04R 17/00* | (2006.01) |
| *H01L 41/18* | (2006.01) |
| *C08K 3/24* | (2006.01) |
| *C08L 101/00* | (2006.01) |
| *H01L 41/37* | (2013.01) |

(52) U.S. Cl.
CPC .............. *H01L 41/183* (2013.01); *C08K 3/24* (2013.01); *C08L 101/00* (2013.01); *H01L 41/37* (2013.01); *C08K 2201/00* (2013.01); *H04R 17/00* (2013.01)

(58) Field of Classification Search
CPC .............................. H01L 41/183; H01L 41/37
See application file for complete search history.

(56) References Cited

FOREIGN PATENT DOCUMENTS

| JP | 2003-176390 A | 6/2003 |
|---|---|---|
| JP | 2008-294493 A | 12/2008 |
| JP | 2009-103484 A | 5/2009 |

OTHER PUBLICATIONS

Van den Ende et al, "The effect of calcining tempeature on the propeties of 0-3 piezoelectric cmposites of PZT and a liquid crystalline thermoplastic polymer", J. Electroceram, 27, 2011, pp. 13-19.*
English translation of the International Preliminary Report on Patentability and Written Opinion of the International Searching Authority (Forms PCT/IB/338, PCT/IB/373 and PCT/ISA/237), dated Oct. 8, 2015, for International Application No. PCT/JP2014/059350.
Japanese Notification of Reasons for Refusal and English translation thereof, dated May 31, 2016, for corresponding Japanese Application No. 2013-075123.
International Search Report issued in PCT/JP2014/059350, dated Jul. 8, 2014.
Kitayama, "366 Piezoelectric characteristics of polymer-ceramic composite", 1971 National Conference Proceedings of the Institute of Electronics, Information and Communication Engineers, 366, 1971, p. 368.
Shirai et al., "A Microphone for telephone using composite piezoelectric polymer", Institute of Electronics, Information and Communication Engineers Technical Report, vol. 24, No. 15, 1980, pp. 1-10.
Van Den Ende et al., "The effect of calcining temperature on the properties of 0-3 piezoelectric composites of PZT and a liquid crystalline thermosetting polymer", Journal of Electroceramics, vol. 27, Issue 1, Springer US, Aug. 1, 2011, pp. 13-19.

* cited by examiner

*Primary Examiner* — C Melissa Koslow
(74) *Attorney, Agent, or Firm* — Birch, Stewart, Kolasch & Birch, LLP (57) ABSTRACT

A piezoelectric polymer composite material includes piezoelectric particles dispersed in a matrix made from a polymer material. The piezoelectric particles is composed primarily of lead zirconate titanate having a general formula of $Pb(Zr_xTi_{1-x})O_3$ and each of the piezoelectric particles contains a mixture of tetragonal crystals and rhombohedral crystals.

8 Claims, 4 Drawing Sheets

PIEZOELECTRIC POLYMER COMPOSITE MATERIAL

CROSS-REFERENCE TO RELATED APPLICATIONS

This application is a Continuation of PCT International Application No. PCT/JP2014/059350 filed on Mar. 28, 2014, which claims priority under 35 U.S.C. § 119(a) to Japanese Patent Application No. 2013-075123 filed on Mar. 29, 2013. The above application is hereby expressly incorporated by reference, in its entirety, into the present application.

BACKGROUND OF THE INVENTION

The present invention relates to a piezoelectric polymer composite material that can be used in an electroacoustic conversion film or the like for use in a speaker, a microphone, or the like.

Development is currently proceeding on flexible displays such as organic electroluminescent displays that utilize flexible substrates like plastic.

When this type of flexible display is used as part of a dual image display/audio playback device that displays images as well as plays audio, such as a television receiver, a speaker (an acoustic device) is required to generate the audio.

Conventional examples of speaker shapes typically include a so-called cone speaker in the form of a funnel and dome speakers in the form of a sphere. However, attempting to incorporate these speakers into the abovementioned type of flexible display generally impairs some of the inherent advantages of flexible displays, such as light weight and flexibility. Moreover, using external speakers makes the overall device more difficult to carry or move, makes it more difficult to set up the device on curved walls, and negatively affects the aesthetic appearance of the device.

To solve these problems, JP 2008-294493 A, for example, discloses using flexible sheet-shaped piezoelectric films to provide speakers that can be integrated into a flexible display without negatively affecting the light weight or flexibility of the display.

A piezoelectric film refers to a film created by poling a uniaxially stretched polyvinylidene diflouride (PVDF) film at high voltage. The resulting piezoelectric film exhibits the property of expanding or contracting in response to applied voltages.

Consider a portable flexible display that has a rectangular planar shape into which a speaker made from a piezoelectric film is integrated, that can be held in a gently bent state like print materials such as newspapers or magazines, and in which the screen display can be switched between a vertical and a horizontal orientation. In such a display, the image display surface is preferably able to bend not only in the vertical direction but also in horizontal direction.

However, the piezoelectric properties of a piezoelectric film made from uniaxially stretched PVDF exhibit in-plane anisotropy, and therefore, sound quality can differ significantly for a given curvature depending on the bending direction.

One example of a piezoelectric material that can be formed in a flexible sheet shape and in which the piezoelectric properties do not exhibit in-plane anisotropy, thereby solving the abovementioned problem, is a piezoelectric polymer composite material in which piezoelectric particles are dispersed in a polymer matrix.

KITAYAMA Toyoki, 1971 National Conference Proceedings of the Institute of Electronics, Information and Communication Engineers, 366 (1971), for example, discloses a piezoelectric polymer composite material produced by mixing powdered PZT ceramic (a piezoelectric material) with PVDF using a solvent casting process or a heated mixing process. The resulting piezoelectric polymer composite material retains both the flexibility of the PVDF and the high piezoelectric properties of the PZT ceramic.

In such a piezoelectric polymer composite material, the ratio of piezoelectric particles relative to the matrix is preferably increased in order to enhance the piezoelectric properties (that is, transmitting efficiency). However, piezoelectric polymer composite materials tend to become harder and more brittle as the amount of piezoelectric particles relative to the matrix increases.

SHIRAI Seiichi, NOMURA Hiroaki, OGA Juro, YAMADA Takeshi, OGUCHI Nobuki, Institute of Electronics, Information and Communication Engineers Technical Report, 24, 15 (1980) discloses adding a fluororubber to the PVDF in the piezoelectric polymer composite material disclosed in KITAYAMA Toyoki, 1971 National Conference Proceedings of the Institute of Electronics, Information and Communication Engineers, 366 (1971) in order to preserve the flexibility of the material and thereby solve the abovementioned problem.

SUMMARY OF THE INVENTION

As described in KITAYAMA Toyoki, 1971 National Conference Proceedings of the Institute of Electronics, Information and Communication Engineers, 366 (1971) and SHIRAI Seiichi, NOMURA Hiroaki, OGA Juro, YAMADA Takeshi, OGUCHI Nobuki, Institute of Electronics, Information and Communication Engineers Technical Report, 24, 15 (1980), lead zirconate titanate (PZT) particles are used for the piezoelectric particles in the piezoelectric polymer composite material.

The general formula for PZT is $Pb(Zr_xTi_{1-x})O_3$. PZT is a piezoelectric material that exhibits good piezoelectric properties.

Such PZT particles are typically produced by mixing together lead oxide powder, zirconium oxide powder, and titanium oxide powder and sintering the resulting mixture of raw materials (to produce a PZT ceramic (a piezoelectric ceramic)). Moreover, in order to achieve better piezoelectric properties, the PZT particles are typically sintered at a final temperature of 1100-1200° C. for 3-5 hours to produce a sintered compact.

Furthermore, it is well known that ferroelectric materials such as PZT that take a perovskite structure can be synthesized to have a phase boundary (a morphotropic phase boundary (MPB)) composition in order to achieve better piezoelectric properties. The MPB composition of PZT occurs when the value of x in the general chemical formula for PZT given above is approximately 0.52 (that is, $Pb(Zr_{0.52}Ti_{0.48})O_3$).

When manufacturing the ceramic particles using a sintering process, the composition ratio of Zr and Ti in the resulting particles is substantially equivalent to that of the raw material composition (the so-called preparation composition). Therefore, PZT particles having the MPB composition can be produced by preparing the raw material powder used to create the sintered compact such that the molar ratio of zirconium oxide powder to titanium oxide powder is 0.52:0.48.

Using sintered PZT particles having the MPB composition makes it possible to obtain a piezoelectric polymer composite material having good piezoelectric properties.

However, increasingly high requirements have been put on piezoelectric properties in piezoelectric polymer composite materials in recent years, and piezoelectric polymer composite materials with increasingly high piezoelectric properties are in demand.

The present invention aims to solve the abovementioned problems with conventional technologies by providing a piezoelectric polymer composite material produced by dispersing piezoelectric particles in a polymer matrix and in which PZT particles are used as the piezoelectric particles in order to achieve higher piezoelectric properties.

In order to achieve the foregoing object, the present invention provides a piezoelectric polymer composite material comprising piezoelectric particles dispersed in a matrix made from a polymer material, the piezoelectric particles being composed primarily of lead zirconate titanate having a general formula of $Pb(Zr_xTi_{1-x})O_3$ and each of the piezoelectric particles containing a mixture of tetragonal crystals and rhombohedral crystals.

In the piezoelectric polymer composite material of the present invention, it is preferred that each of the piezoelectric particles contains a mixture of regions having respectively different values of x ranging from 0.3-0.7 in the general formula when a composition of the piezoelectric particles is analyzed using energy dispersive X-ray spectrometry.

Preferably, an average value of x in the general formula for all of the piezoelectric particles is 0.52±0.10.

Preferably, the piezoelectric particles are a polycrystalline material.

Preferably, values of x in the general formula of primary particles of the polycrystalline material range from 0.3-0.7 and each of piezoelectric particles contains a mixture of primary particles having respectively different values of x when a composition of the piezoelectric particles is analyzed using energy dispersive X-ray spectrometry.

Also, it is preferred that each of the piezoelectric particles contains a mixture of regions having a value of x in the general formula is +0.1 or more relative to an average value of x of all of the piezoelectric particles as well as regions having a value of x is −0.1 or less relative to the average value of x of all of the piezoelectric particles when a composition of the piezoelectric particles is analyzed using energy dispersive X-ray spectrometry.

Preferably, when particle sizes of the piezoelectric particles are measured using a laser diffraction particle size measurement device, a median diameter ($D_{50}$) is 2-5 μm.

Also, it is preferred that when particle sizes of the piezoelectric particles are measured using a laser diffraction particle size measurement device, a ratio of the piezoelectric particles greater than or equal to 10 μm in particle size is 5-30 vol % of all of the piezoelectric particles.

Further, it is preferred that when particle sizes of the piezoelectric particles are measured using a laser diffraction particle size measurement device, a ratio of the piezoelectric particles less than or equal to 1 μm in particle size is less than or equal to 10 vol % of all of the piezoelectric particles.

Preferably, the matrix is made from a polymer material that exhibits viscoelasticity at normal temperatures.

The piezoelectric polymer composite material of the present invention has higher piezoelectric properties than conventional piezoelectric polymer composite materials that utilize sintered PZT particles.

Moreover, according to the piezoelectric polymer composite material of the present invention, it is possible to drastically simplify the method for manufacturing the PZT particles and therefore to reduce the cost of the piezoelectric polymer composite material.

DETAILED DESCRIPTION OF THE INVENTION

Next, the piezoelectric polymer composite material of the present invention will be described in detail using a preferred embodiment as illustrated in the attached drawings.

Figure 1:
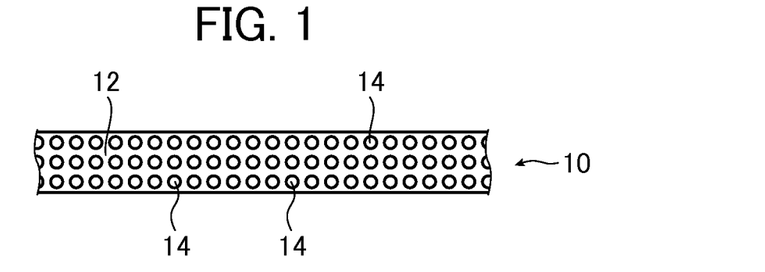
FIG. 1 conceptually illustrates an example of a piezoelectric polymer composite material of the present invention.

FIG. 1 conceptually illustrates an example of a piezoelectric polymer composite material of the present invention.

As illustrated in FIG. 1, a piezoelectric polymer composite material 10 of the present invention (hereafter, may be referred to as "piezoelectric composite 10") includes piezoelectric particles 14 dispersed in a matrix 12 made from a polymer material.

In FIG. 1, the piezoelectric particles 14 are dispersed in the matrix 12 regularly; however, the present invention is not limited to this configuration.

In other words, in the piezoelectric composite 10 of the present invention, as long as the piezoelectric particles 14 are preferably dispersed uniformly in the matrix 12, the piezoelectric particles 14 may be dispersed either regularly or irregularly in the matrix 12.

In the piezoelectric composite 10 of the present invention, the piezoelectric particles 14 are lead zirconate titanate (PZT) particles (particles composed primarily of PZT).

The general chemical formula for PZT is $Pb(Zr_xTi_{1-x})O_3$ (hereafter, this general formula $Pb(Zr_xTi_{1-x})O_3$ may be referred to as "general formula I").

Note that x<1 in general formula I. Moreover, the x in general formula I is the elemental ratio (molar ratio) of zirconium to titanium, that is, Zr/(Zr+Ti).

In the piezoelectric composite 10 of the present invention, each of piezoelectric particles 14 contains a mixture of tetragonal crystals and rhombohedral crystals.

By using this type of piezoelectric particles 14, the piezoelectric composite 10 of the present invention achieves better piezoelectric properties than conventional piezoelectric polymer composite materials that use a crushed PZT sintered compact for the piezoelectric particles.

As described above, in conventional piezoelectric polymer composite materials that use PZT for the piezoelectric particles, a PZT sintered compact produced by sintering raw materials at a high temperature of 1100-1200° C. for 1-10 hours is crushed to obtain the PZT particles. In typical piezoelectric ceramics, the density of the ceramic is of critical importance for achieving high piezoelectric properties. Therefore, production of piezoelectric ceramics typically includes a heat treatment at a high temperature of 1000° C. or higher in order to obtain a dense sintered compact. This compacting process is always accompanied by long-range diffusion of the atoms, and therefore even if the compositions of the individual particles are non-uniform prior to the sintering process, by the time the material becomes a dense sintered compact, the resulting PZT sintered compact has a substantially uniform composition.

As a result, in contrast to the prediction that a PZT sintered compact having a phase boundary (a morphotropic phase boundary (MPB)) composition in which the value of x in general formula I is 0.52 (that is, $Pb(Zr_{0.52}Ti_{0.48})O_3$) would contain a mixture of tetragonal crystals and rhombohedral crystals, it has been reported that such a material contains only tetragonal crystals (K. Kakegawa, J. Mohri, T. Takahashi, H. Yamamura and S. Shirasaki: Solid State Commun. 24, 769 (1977)). This will be demonstrated later in the working examples.

Therefore, a powder obtained by crushing such a PZT sintered compact will also contain only tetragonal crystals.

In contrast, the piezoelectric composite 10 of the present invention uses PZT particles in which each of piezoelectric particles 14 contains a mixture of tetragonal crystals and rhombohedral crystals.

Therefore, in the piezoelectric composite 10 of the present invention, phase boundaries exist between the tetragonal crystal regions and the rhombohedral crystal regions in the piezoelectric particles 14. These phase boundaries are extremely sensitive to applied electric fields and therefore contribute significantly to the improvement of the piezoelectric properties of the material. In other words, the piezoelectric particles 14 exhibit extremely high piezoelectric properties due to the phase boundaries within the particles.

By using this type of piezoelectric particles 14, the piezoelectric composite 10 of the present invention achieves better piezoelectric properties than conventional piezoelectric polymer composite materials that use a PZT sintered compact for the piezoelectric particles. This will be demonstrated later in the working examples.

These piezoelectric particles 14, in which each of the piezoelectric particles 14 contains a mixture of tetragonal crystals and rhombohedral crystals, can be produced by having a mixture of regions having different compositions in each PZT particle.

More specifically, when the piezoelectric particles (PZT particles) 14 of the piezoelectric composite 10 of the present invention are analyzed using energy-dispersive X-ray spectroscopy (hereafter, may be referred to as EDX), each particle contains a mixture of regions in which the value of x in general formula I ($Pb(Zr_xTi_{1-x})O_3$) ranges from 0.3-0.7, with different regions having respectively different values of x. In other words, when the piezoelectric particles 14 of the piezoelectric composite 10 of the present invention are analyzed using EDX, each of piezoelectric particles 14 contains a mixture of PZT in which the value of x in general formula I ranges from 0.3-0.7, with each PZT having different values of x.

It is well known that PZT is a solid solution of lead zirconate ($PbZrO_3$) and lead titanate ($PbTiO_3$). Here, the regions of the PZT material where there is more lead zirconate (regions in which x is greater than or equal to 0.52—hereafter, may be referred to as "Zr-rich regions") take a tetragonal crystal structure, and the regions of the PZT material where there is more lead titanate (regions in which x is less than 0.52—hereafter, may be referred to as "Ti-rich regions") take a rhombohedral crystal structure.

Therefore, having a mixture of Zr-rich regions and Ti-rich regions within each of piezoelectric particles 14 containing PZT makes it possible to have a mixture of tetragonal crystal regions and rhombohedral crystal regions within each of piezoelectric particles 14.

In other words, altering the composition of Zr and Ti in each of piezoelectric particles 14 to have discontinuous neighboring Zr-rich regions and Ti-rich regions makes it possible to have a mixture of tetragonal crystal regions and rhombohedral crystal regions within each of piezoelectric particles 14 and to thereby introduce phase boundaries.

In the piezoelectric particles 14 of the piezoelectric composite 10 of the present invention, while each individual particle includes a variety of compositions and the particles collectively exhibit a variety of compositions, the value of x in general formula I is preferably equal to 0.52±0.10 when the overall composition of all of the piezoelectric particles 14 is examined. In other words, the average value of x of all of the piezoelectric particles 14 of the piezoelectric composite 10 of the present invention is preferably equal to 0.52±0.10.

It is more preferable that when the overall composition of the piezoelectric particles 14 of the piezoelectric composite 10 of the present invention is examined, the value of x in general formula I be equal to 0.52±0.05, and it is particularly preferable that x be exactly equal to 0.52.

When x is equal to 0.52±0.10 when the overall composition of the piezoelectric particles 14 of the piezoelectric composite 10 of the present invention is examined, the overall composition of the piezoelectric particles 14 is close to the phase boundary composition. This makes it possible to achieve high piezoelectric properties.

The piezoelectric particles 14 used in the piezoelectric composite 10 of the present invention are preferably produced by mixing lead oxide powder, zirconium oxide powder, and titanium oxide powder and then sintering the resulting mixture at 700-800° C. for 3-6 hours, as described below.

Manufacturing the piezoelectric particles 14 using such a sintering process may vaporize a small amount of the Pb. However, the overall composition ratios of Zr and Ti in the resulting piezoelectric particles 14 are substantially equal to the amounts of each powder originally mixed together. In other words, the overall Zr and Ti composition ratios in the piezoelectric particles 14 are substantially equal to those of the so-called preparation composition.

Therefore, by adjusting the preparation composition used to produce the piezoelectric particles 14 according to the desired overall composition for the resulting piezoelectric particles 14, the desired overall composition for the piezoelectric particles 14 can be achieved.

When analyzed using EDX, each of piezoelectric particles 14 of the piezoelectric composite 10 of the present invention preferably contains a mixture of regions in which the value of x in general formula I is +0.1 or more relative to the average value of x in all of the piezoelectric particles 14 (that is, the overall composition of all of the piezoelectric particles 14) as well as regions in which the value of x is −0.1 or less relative to the average value of x.

Such a configuration results in a large variation of compositions within each of piezoelectric particles 14 and makes it possible to have a mixture of Zr-rich regions and Ti-rich regions, which in turn makes it possible to more reliably and favorably have a mixture of tetragonal crystals and rhombohedral crystals within each of piezoelectric particles 14, thereby making it possible to provide a piezoelectric composite 10 with higher piezoelectric properties.

In the piezoelectric composite 10 of the present invention, a variety of forms of piezoelectric particles 14 can be used. In other words, the piezoelectric particles 14 of the present invention may have a polycrystalline structure, a monocrystalline structure, or a so-called core-shell structure having a core portion and a shell portion, for example.

Among these, the piezoelectric particles 14 are preferably polycrystalline due to the high associated manufacturability and low associated production costs by sintering.

Moreover, when the piezoelectric particles 14 are polycrystalline, the primary particles that compose this polycrystalline material preferably have a composition in which the value of x in general formula I is 0.3-0.7 when analyzed using EDX. Furthermore, when the piezoelectric particles 14 are a polycrystalline material, each of piezoelectric particles 14 preferably contains a mixture of primary particles having compositions with different values of x.

This makes it possible to more reliably and favorably have a mixture of tetragonal crystals and rhombohedral crystals within each of piezoelectric particles 14 by having a mixture of Zr-rich regions and Ti-rich regions, thereby making it possible to provide a piezoelectric composite 10 with higher piezoelectric properties.

The particle size for the piezoelectric particles 14 may be selected as appropriate based on the size and usage of the piezoelectric composite 10.

Here, research performed by the inventor indicated that the particle size of the piezoelectric particles 14 is preferably 1-30 μm when measured using a laser diffraction particle size measurement device.

Using piezoelectric particles 14 having a particle size in this range makes it possible to achieve preferable effects such as having both high piezoelectric properties and flexibility.

In the piezoelectric composite 10 of the present invention, the particle sizes of the piezoelectric particles 14 as measured using a laser diffraction particle size measurement device preferably exhibit a median diameter ($D_{50}$) of 2-5 μm.

Using piezoelectric particles 14 with a median diameter of 2-5 μm makes it possible to achieve preferable effects such as a uniform and dense distribution of piezoelectric particles 14 in the piezoelectric composite 10 even when produced using mass production methods such as a solvent coating method in which the matrix 12 is dissolved in a solvent and the piezoelectric particles 14 are dispersed therein to prepare a coating material to be used in the method.

Moreover, the ratio of the piezoelectric particles greater than or equal to 10 μm in particle size is preferably 5-30 vol % of all of the piezoelectric particles 14 when measured using a laser diffraction particle size measurement device.

Because the ratio of the piezoelectric particles greater than or equal to 10 μm in particle size is greater than or equal to 5 vol % of all of the piezoelectric particles 14, higher piezoelectric properties can be obtained by increasing the transmitting efficiency of the vibration energy within piezoelectric composite 10.

Meanwhile, achieving high piezoelectric properties in the piezoelectric composite 10 requires increasing the volume percentage of piezoelectric particles 14 in the piezoelectric composite 10 to a certain degree. Keeping the amount of particles greater than or equal to 10 μm less than or equal to 30 vol % of all the particles allows smaller particles to fill the gaps between larger particles and thereby makes it possible to increase the volume percentage of piezoelectric particles 14 in the piezoelectric composite 10.

However, it is not preferable that these small particles be so small that they no longer exhibit piezoelectric properties due to so-called size effects. More specifically, the ratio of particles less than or equal to 1 μm in particle size (as measured by a laser diffraction particle size measurement device) is preferably less than or equal to 10 vol %, of all of the piezoelectric particles 14.

This type of piezoelectric particles 14 can be produced by sintering, for example.

More specifically, lead oxide powder, zirconium oxide powder, and titanium oxide powder are mixed together in ratio of amounts appropriate to obtain the desired overall composition for the piezoelectric particles 14 to prepare a raw material powder mixture. As described above, the overall composition of the piezoelectric particles 14 is substantially equivalent to the composition of this raw material powder mixture (the preparation composition).

Next, this raw material powder mixture is placed in a crucible or the like and sintered at a temperature of 700-800° C. for 3-6 hours.

This sintering temperature does not allow the atoms to experience sufficient long-range diffusion and leaves the solid-state reaction of the PZT incomplete (in other words, a PZT sintered compact is not formed). Therefore, the piezoelectric particles 14 (PZT particles) resulting from this sintering process are polycrystalline, and each particle contains a mixture of Zr-rich regions and Ti-rich regions. In this way, piezoelectric particles 14 containing a mixture of tetragonal crystals and rhombohedral crystals within each particle can be obtained.

After the sintering process is complete, the resulting piezoelectric particles 14 are crushed as necessary.

The particles may be crushed using any known method. However, if the piezoelectric particles 14 are crushed too extensively, the abovementioned 5-30 vol % of particles greater than or equal to 10 μm cannot be achieved in the piezoelectric particles 14.

One example of a preferable crushing method is placing the piezoelectric particles 14 on a mesh and applying pressure from above to force the particles through the mesh and thereby crush the piezoelectric particles 14.

The mesh size may be selected as appropriate according to the desired particle size. Research performed by the inventor revealed that in order to suitably obtain piezoelectric particles 14 in which 5-30 vol % of the particles are greater than or equal to 10 μm, the mesh size is preferably 28-38 μm.

The crushing process may also be conducted using a ball mill. When a ball mill is used, however, the amount of piezoelectric particles 14 greater than 10 μm in particle size decreases while the amount of particles less than or equal to 1 μm in particle size increases as the crushing process is performed longer. Therefore, when using a ball mill to conduct the crushing process, the crushing process is preferably conducted for a short period of time no longer than 0.5 hours.

As is clear from the description above, this method for manufacturing the piezoelectric particles 14 does not require sintering at a high temperature of 1000° C. or more and the time- and labor-intensive crushing process required for a strongly compacted PZT sintered compact that are necessary in methods for manufacturing a PZT sintered compact for use in conventional piezoelectric polymer composite materials. In other words, the piezoelectric composite 10 of the present invention drastically simplifies the method for manufacturing the piezoelectric particles 14 and makes it possible to obtain a high performance, low cost piezoelectric composite 10.

In the piezoelectric composite 10 of the present invention, any polymer material used in known piezoelectric polymer composite materials can be used for the matrix (polymer matrix) 12.

Specific examples of such polymers include polyvinylidene diflouride (PVDF), cyanoethyl pullulan, nylon, and the like.

Among these, a matrix 12 made from a polymer material that exhibits viscoelasticity at normal temperatures is particularly preferable in the piezoelectric composite 10 of the present invention. In this specification, "normal temperatures" refers to temperatures in the range of 0-50° C.

Figure 2A:
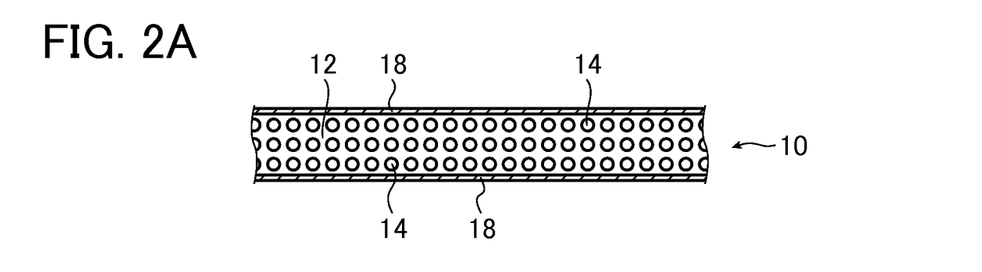
FIGS. 2A and 2B conceptually illustrate examples of electroacoustic conversion films made using the piezoelectric polymer composite material of the present invention.
Figure 2B:
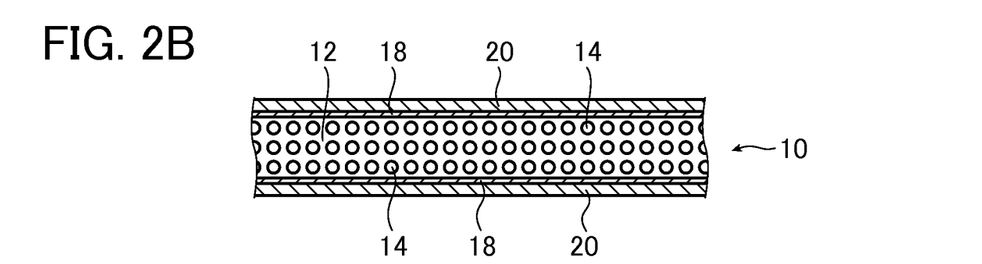

The piezoelectric composite 10 of the present invention is well-suited to use in electroacoustic conversion films such as those conceptually illustrated in FIG. 2A (in which electrode layers 18 are formed on both surfaces) and FIG. 2B (in which protective layers 20 are also formed on the surfaces of the electrode layers 18) for use in a flexible speaker or the like for applications such as speakers for a flexible display.

Examples of materials for the electrode layers 18 include copper, aluminum, gold, silver, platinum, indium tin oxide, and the like. Moreover, preferable examples of materials for the protective layers 20 include, polyethylene terephthalate (PET), polypropylene (PP), polystyrene (PS), polycarbonate (PC), polyphenylene sulfide (PPS), polymethyl methacrylate (PMMA), polyetherimide (PEI), polyimide (PI), polyethylene naphthalate (PEN), triacetylcellulose (TAC), and cyclic olefin resins. Furthermore, if the protective layers 20 are extremely thin and have poor handleability, protective layers 20 that include separators may be used as needed.

For use in a flexible speaker, the piezoelectric composite 10 preferably satisfies the following requirements.

(i) Flexibility

In a portable flexible speaker that can be held in a gently bent state like print materials such as newspapers or magazines, the speaker may experience large and constant bending deformations from the outside at a relatively slow frequency of several Hz or less. If the piezoelectric polymer composite material is hard, such deformations will create large bending stresses which may cause cracks at the interface between the polymer matrix and the piezoelectric particles that may eventually result in destruction of the display. Therefore, the piezoelectric polymer composite material must have a suitable degree of softness. Moreover, if the material can dissipate strain energy to the external environment in the form of heat, the effects of stress can be diminished. Therefore, the piezoelectric polymer composite material must have suitably large loss tangent.

(ii) Sound Quality

The speaker plays audio by inciting vibration of the piezoelectric particles at frequencies of audio band of 20 Hz to 20 kHz, and that vibration energy causes a vibrating plate (the piezoelectric polymer composite material) to vibrate as a whole. Therefore, the piezoelectric polymer composite material must have a suitable degree of hardness in order to increase the transmitting efficiency of vibration energy in the piezoelectric polymer composite material. Moreover, if the speaker has a relatively flat frequency response, changes in sound quality due to changes in the minimum resonant frequency $f_0$ caused by changes in curvature are reduced. Therefore, the piezoelectric polymer composite material must have suitably large loss tangent.

In summary, for use in a flexible speaker, the piezoelectric composite 10 must be hard in response to vibrations of 20 Hz to 20 kHz and must be soft in response to vibrations of a few Hz or less. Moreover, the loss tangent of the piezoelectric composite 10 must be suitably large at all vibration frequencies less than or equal to 20 kHz.

In general, solid polymers have viscoelastic relaxation mechanism, and increases in temperature or decreases in frequency are typically accompanied by large-scale molecular motion that manifests as a decrease in storage modulus (Young's modulus) (relaxation) and an increase in loss modulus (absorption). Relaxation of molecular chains in the amorphous regions caused by micro-Brownian motion is known as primary dispersion and results in exceptionally large relaxations. The temperature at which this primary dispersion occurs is known as the glass transition point (Tg), and viscoelastic relaxation mechanism occurs most prominently at this temperature.

In the piezoelectric composite 10, using a polymer material having a glass transition point at normal temperatures (that is, a polymer material that exhibits viscoelasticity at normal temperatures) for the matrix 12 results in a piezoelectric composite 10 that becomes hard in response to vibrations of 20 Hz to 20 kHz and soft in response to slow vibrations of a few Hz or less. In particular, in order to achieve this favorable behavior, a polymer material having a glass transition temperature within the range of normal temperatures with a frequency of 1 kHz is preferably used as the matrix 12 of the piezoelectric composite 10.

Any known polymer material that exhibits viscoelasticity at normal temperatures can be used. A polymer material having a maximum loss tangent tan δ greater than or equal to 0.5 as measured in a dynamic viscoelasticity test at normal temperatures with a frequency of 1 kHz is preferably used.

This ensures that when the piezoelectric composite 10 is bent slowly by external forces, concentration of stress at the interface between the matrix 12 and the piezoelectric particles 14 at the portion that experiences the maximum bending moment is relaxed, thereby making the piezoelectric composite 10 highly flexible.

Moreover, the storage modulus (E') of the polymer material as measured in a dynamic viscoelasticity test at 1 kHz is preferably greater than or equal to 100 MPa at 0° C. and less than or equal to 10 MPa at 50° C.

This results in a reduction of the bending moment that occurs when the piezoelectric composite 10 is bent slowly by external forces and also makes the piezoelectric composite 10 become hard in response to acoustic vibrations of 20 Hz to 20 kHz.

Moreover, it is more preferable that the relative dielectric constant of the polymer material be greater than or equal to 10 at 25° C. It may be expected that when a voltage is applied to the piezoelectric polymer composite material, a stronger electric field will be applied to the piezoelectric particles 14 in the matrix 12 and thereby cause larger deformations of the piezoelectric particles 14.

However, in contrast, it is also preferable that the relative dielectric constant of the polymer material be less than or equal to 10 at 25° C. in consideration of preserving satisfactory moisture-resistance and the like.

Examples of polymer materials that fulfill these requirements include cyanoethylated polyvinyl alcohol (cyanoethylated PVA), polyvinyl acetate, polyvinylidene chloride-co-acrylonitrile, a polystyrene-vinylpolyisoprene block copolymer, polyvinyl methyl ketone, polybutyl methacrylate, and the like. Moreover, commercially available products such as Hybrar 5127 (Kurary Co., Ltd.) may also be preferably used for this polymer material.

Furthermore, a single one of these polymer materials or a mixture of these polymer materials may be used.

A plurality of these types of polymer materials may be used in combination as the polymer material that exhibits viscoelasticity at normal temperatures used for the matrix 12 as needed.

In other words, in order to adjust the dielectric properties or mechanical properties or the like of the matrix 12, a dielectric polymer material may be used in addition to a viscoelastic material such as cyanoethylated PVA as needed.

Examples of dielectric polymer materials that can be added include polyvinylidene diflouride; a vinylidene fluoride-tetrafluoroethylene copolymer; a vinylidene fluoride-trifluoroethylene copolymer; fluoropolymers such as a polyvinylidene difluoride-trifluoroethylene copolymer or a polyvinylidene diflouride-tetrafluoroethylene copolymer; polymers having a cyano group or a cyanoethyl group such as a vinylidene cyanide-vinyl acetate copolymer, cyanoethyl cellulose, cyanoethyl hydroxy saccharose, cyanoethyl hydroxy cellulose, cyanoethyl hydroxy pullulan, cyanoethyl methacrylate, cyanoethyl acrylate, cyanoethyl hydroxyethyl cellulose, cyanoethyl amylose, cyanoethyl hydroxypropyl cellulose, cyanoethyl dihydroxypropyl cellulose, cyanoethyl hydroxypropyl amylose, cyanoethyl polyacrylamide, cyanoethyl polyacrylate, cyanoethyl pullulan, cyanoethyl polyhydroxy methylene, cyanoethyl glycidol pullulan, cyanoethyl saccharose, and cyanoethyl sorbitol; and synthetic rubbers such as nitrile rubber or chloroprene rubber.

Among these, a polymer material having a cyanoethyl group is preferably used.

Note that in the matrix 12 of the piezoelectric composite 10, the dielectric polymer added to the material that exhibits viscoelasticity at normal temperatures such as cyanoethylated PVA is not limited to a single polymer and may be a plurality of polymers.

Moreover, a thermoplastic resin such as vinyl chloride resin, polyethylene, polystyrene, methacrylic resin, polybutene, or isobutylene or a thermosetting resin such as phenolic resin, urea resin, melamine resin, alkyd resin, or mica may be added in addition to the dielectric polymer material in order to adjust the glass transition point (Tg).

Furthermore, a tackifier such as rosin ester, rosin, terpene, terpene phenol, petroleum resin, or the like may be added in order to improve adhesive properties.

The amount of polymers other than the viscoelastic polymer such as cyanoethylated PVA added to the matrix 12 of the piezoelectric composite 10 is not particularly limited; however, such additive polymers are preferably less than or equal to 30 wt % of the matrix 12.

This ensures that the properties of the added polymer materials can manifest without impairing the viscoelastic relaxation mechanism of the matrix 12, thereby making it possible to achieve preferable effects such as high dielectric constant, improved heat resistance, and improved adhesion between the piezoelectric particles 14 and the electrode layers.

The amount ratio between the amounts of the matrix 12 and the piezoelectric particles 14 in the piezoelectric composite 10 of the present invention may be set appropriately according to the (planar) size and thickness of the piezoelectric composite 10, the usage of the piezoelectric composite 10, the properties required for the piezoelectric composite 10, or the like.

Research performed by the inventor revealed that the volume percentage of piezoelectric particles 14 in the piezoelectric composite 10 is preferably 30-70% and in particular the volume percentage of piezoelectric particles 14 is preferably greater than or equal to 50%, and therefore the volume percentage of piezoelectric particles 14 is more preferably 50-70%.

Setting the amount ratio between the amounts of the matrix 12 and the piezoelectric particles 14 to a value in the above range makes it possible to achieve preferable effects such as having both high piezoelectric properties and flexibility.

Moreover, the thickness of the piezoelectric composite 10 of the present invention may be set appropriately according to the planar size of the piezoelectric composite 10, the usage of the piezoelectric composite 10, the properties required for the piezoelectric composite 10, the materials used for the matrix 12 and the piezoelectric particles 14 in the piezoelectric composite 10, or the like.

Here, research performed by the inventor revealed that the thickness of the piezoelectric composite 10 is preferably 10-200 μm and particularly preferably 15-100 μm.

Setting the thickness of the piezoelectric composite 10 to a value in the range above makes it possible to achieve preferable effects such as obtaining suitable flexibility while preserving suitable rigidity, and the like.

The piezoelectric composite 10 can be produced using the same methods used to produce known piezoelectric polymer composite materials.

In other words, the polymer material for the matrix 12 is dissolved in an organic solvent, and the piezoelectric particles 14 are added to the resulting solution and dispersed therein to prepare coating material in which the piezoelectric particles 14 are dispersed in the polymer material and the organic solvent.

The organic solvent is not particularly limited. Various organic solvents such as dimethylformamide (DMF), methyl ethyl ketone, or cyclohexanone can be used.

When a coating material is prepared in this manner, the resulting coating material can be cast (applied) onto a sheet-shaped member and then left for the organic solvent to evaporate and the coating material to dry to form the piezoelectric composite 10. Here, the abovementioned electrode layers 18 or a layered assembly that includes the electrode layers 18 and the protective layers 20 may be used as the sheet-shaped member.

The casting method for this coating material is not particularly limited, and all known methods (coating devices) such as slide coaters or doctor blades can be used.

When the piezoelectric composite 10 is produced in this manner, a poling treatment is preferably performed on the piezoelectric composite 10. Any known method can be used to perform the poling treatment on the piezoelectric composite 10.

Moreover, a calendering process in which a heated roller or the like is used to smooth the surface of the piezoelectric composite 10 may be performed prior to the poling treatment. This calendering process makes it easier to perform a later thermocompression bonding process.

Next, a preferable example of a method for performing the poling treatment will be described.

The piezoelectric composite 10 is placed on a conductive sheet (or alternatively, the electrode layer 18 is formed on one surface of the piezoelectric composite 10), and using a wire-shaped corona electrode or the like that extends in one direction, a DC power source is connected to the conductive sheet and to the corona electrode.

Then, using a heat source, the piezoelectric composite 10 is heated to and maintained at a temperature of 100° C., for example. Using the DC power source, a DC voltage several kV in magnitude (6 kV, for example) is applied between the conductive sheet and the corona electrode to create a corona discharge.

In this state, the corona electrode is moved over the surface of the piezoelectric composite 10 in a direction orthogonal to the direction in which the corona electrode extends (that is, in a scanning motion) while maintaining a prescribed gap therebetween to perform the poling treatment on the piezoelectric composite 10.

As described above, electrode layers 18 (or protective layers 20 as well) may be formed on both surfaces of the piezoelectric composite 10, for example, to produce an electroacoustic conversion film for playing audio by vibrating according to electrical signals or for converting audio vibrations into electrical signals in speakers, microphones or in various acoustic devices (audio equipment) such as the pickups used in musical instruments such as guitars.

The piezoelectric polymer composite material of the present invention was described in detail above. However, the present invention is not limited to the examples given above, and various improvements or modifications may be made to the present invention without departing from the spirit thereof.

EXAMPLES

Next, specific working examples of the present invention will be described to describe the piezoelectric polymer composite material of the present invention in more detail.

Working Example 1

A powder mixture composed primarily of Pb oxide powder, Zr oxide powder, and Ti oxide powder was wet-blended in a ball mill for 12 hours to produce a starting material. The amount of each oxide was set such that for 1 mole of Pb, there was 0.52 moles of Zr and 0.48 moles of Ti.

This raw material powder mixture then placed in a crucible and sintered at 800° C. for 5 hours to produce PZT particles (hereafter, may be referred to as "raw material particles").

The particle size distribution of the raw material particles thus produced was measured using a laser diffraction particle size measurement device (Microtrac MT3300 manufactured by Nikkiso co., Ltd). The median diameter ($D_{50}$) was 4.2 μm. The ratio of particles less than or equal to 1 μm ($V_{<1\ \mu m}$) was 5.9 vol %. The ratio of particles greater than or equal to 10 μm ($V_{>10\ \mu m}$) was 22.0 vol %.

Moreover, the specific surface area of the raw material particles was measured using the Brunauer-Emmett-Teller (BET) method using a specific surface area measurement device (Macsorb HM Model-1201 manufactured by Mountech co., Ltd) and found to be 0.410 m²/g.

Furthermore, from the X-ray diffraction (XRD) pattern near 44° as measured using an X-ray diffractometer (RINT-Ultima III manufactured by Rigaku Corporation), the full width at half maximum (200) (a measure of crystallinity) was found to be 0.27.

The raw material particles were then placed on a mesh having a mesh size of 30 μm and crushed by applying pressure from above to force the raw material particles through the mesh and produce piezoelectric particles 14.

Then, the particle size distribution and specific surface area of these piezoelectric particles 14 were measured as described above. The median diameter ($D_{50}$) was 3.4 μm. The ratio of particles less than or equal to 1 μm ($V_{<1\ \mu m}$) was 7.0 vol %. The ratio of particles greater than or equal to 10 μm ($V_{>10\ \mu m}$) was 13.3 vol %. The specific surface area was 0.496 m²/g.

Furthermore, the compositions of five of the piezoelectric particles 14 that were selected at random were tested at approximately 10 locations per particle using a scanning transmission electron microscope (HD-2300 manufactured by Hitachi High-Technologies Corporation) and an energy dispersive X-ray (EDX) spectroscope (Horan System Six 300 manufactured by Thermo-Electron Corporation). All of the tested particles exhibited values of x in general formula I ranging from 0.3-0.7 as well as mixtures of regions having respectively different values of x.

Figure 3A:
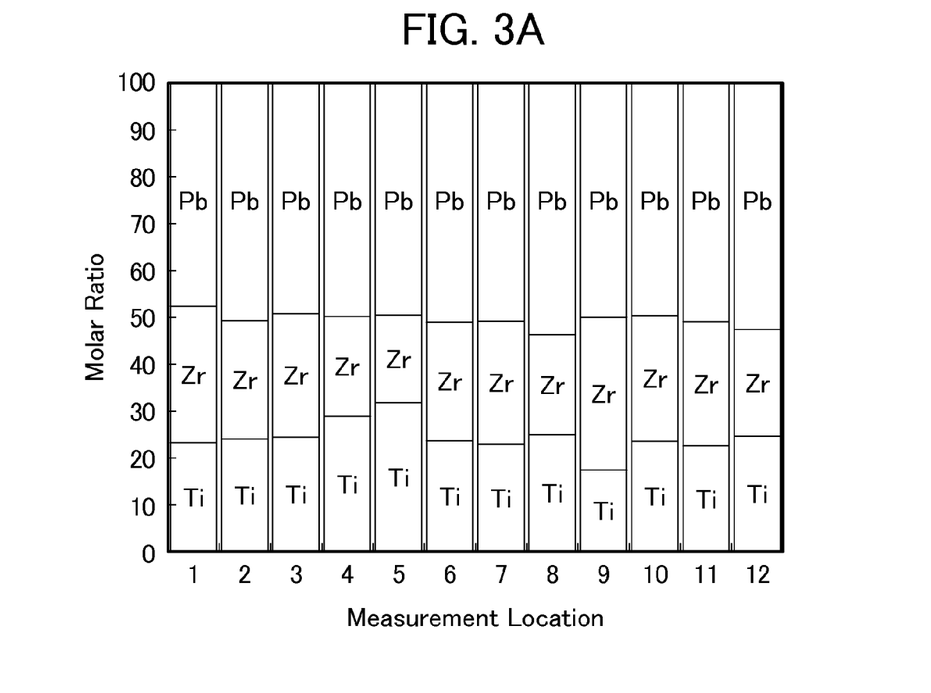
FIG. 3A is a graph showing the composition of a piezoelectric particle used in the piezoelectric polymer composite material of the present invention.

FIG. 3A shows the composition of one of the particles selected at random. Note that the horizontal axis is numbered by arbitrarily set measurement locations on the particle.

A mixture containing 300 parts by mass of the resulting piezoelectric particles 14, 30 parts by mass of cyanoethylated polyvinyl alcohol (CR-V manufacture by Shin-Etsu Chemical Co., Ltd), and 70 parts by mass of dimethylformamide (DMF) was mixed and then blended with a propeller mixer (at 2000 rpm) to prepare a coating material for producing a piezoelectric composite 10.

Next, this coating material was applied to an aluminum sheet 300 μm in thickness using a slide coater. The thickness of the applied coating material was set such that the film thickness of the dried film would be 40 μm.

Next, the assembly was heated for 1 hour on a hot plate set to a temperature of 120° C. to vaporize the DMF and dry the coating material. This process produced a piezoelectric composite 10 having a thickness of 40 μm on the aluminum sheet.

The aluminum sheet and a wire-shaped corona electrode were connected to a DC power source. While applying a DC voltage of 6 kV between the corona electrode and the aluminum sheet, the corona electrode scanned over the piezoelectric composite 10 to perform a poling treatment on the piezoelectric composite 10.

A gap of 3 mm was maintained between the corona electrode and the piezoelectric composite 10 during the poling treatment, and the corona electrode scanned in two trips over the piezoelectric composite 10 at a scanning speed of 5 mm/sec. Moreover, the piezoelectric composite 10 was heated to 90° C. during the poling treatment.

Figure 4A:
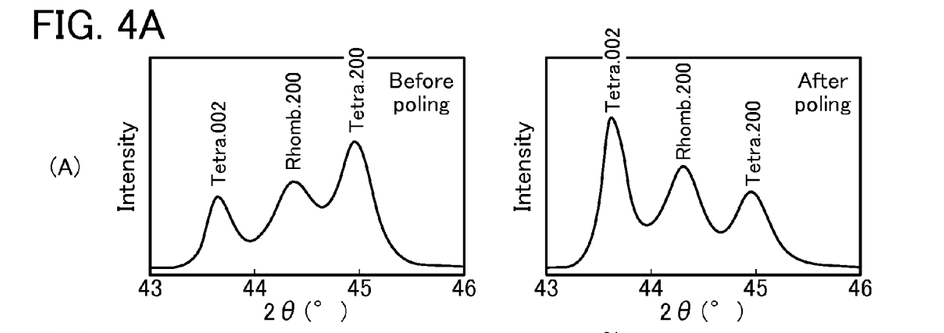
FIGS. 4A to 4D are XRD patterns in working examples of the present invention.

The crystal structures of the piezoelectric particles 14 of the piezoelectric composite 10 were analyzed before and after the poling treatment through X-ray diffraction (XRD) using an X-ray diffractometer (RINT-Ultima III manufactured by Rigaku Corporation). FIG. 4A shows the resulting XRD patterns near 44°.

As shown in FIG. 4A, a rhombohedral peak (Rhomb. 200) was observed between a tetragonal peak near 43.5° (Tetra. 002) and a tetragonal peak near 45° (Tetra. 200). This result confirmed that the variation in the Zr/Ti ratios in the earlier EDX compositional analysis of one of the piezoelectric particles 14 corresponded to a mixture of tetragonal crystals and rhombohedral crystals in the piezoelectric particle 14.

Furthermore, from this XRD pattern near 44°, the full width at half maximum (200) (a measure of crystallinity) was found to be 0.27.

Next, an aluminum electrode with a diameter of 15 mm and a thickness of 0.5 μm was formed on the surface of the poled piezoelectric composite 10 using a vacuum deposition process.

Furthermore, the piezoelectric properties (piezoelectric constant) $d_{33}$ of the piezoelectric composite 10 were evaluated using a $d_{33}$ meter (PM300 manufactured by Piezotest Pte. Ltd.). The piezoelectric constant $d_{33}$ was measured at a frequency of 110 Hz, a clamping force of 10 N, and a dynamic force of 0.25 N.

The piezoelectric constant $d_{33}$ of the piezoelectric composite 10 was 90 pC/N.

The results of the measurements above are shown in the table below.

Working Example 2

Piezoelectric particles 14 were produced in the same manner as in Working Example 1 except that the raw material particles were crushed for 0.5 hours in a ball mill prior to being crushed with a mesh. In other words, in the present example the raw material particles were first crushed for 0.5 hours in a ball mill and then crushed using a mesh.

The particle size distribution and specific surface area of the resulting piezoelectric particles 14 were measured in the same manner as in Working Example 1. The median diameter ($D_{50}$) was 3.0 μm. The ratio of particles less than or equal to 1 μm ($V_{<1\,\mu m}$) was 9.2 vol %. The ratio of particles greater than or equal to 10 μm ($V_{>10\,\mu m}$) was 7.6 vol %. The specific surface area was 0.511 m$^2$/g.

Furthermore, in the same manner as in Working Example 1, the compositions of five of the piezoelectric particles 14 that were selected at random were tested at approximately 10 locations per particle using EDX. All of the tested particles exhibited values of x in general formula I ranging from 0.3-0.7 as well as mixtures of regions having respectively different values of x.

Next, in the same manner as in Working Example 1, a piezoelectric composite 10 was formed on an aluminum sheet, and a poling treatment was performed.

Figure 4B:
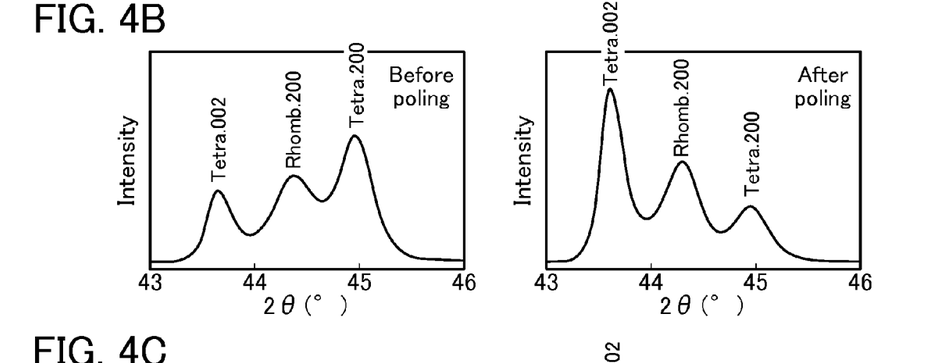

FIG. 4B shows the XRD patterns near 44° of the piezoelectric particles 14 as measured before and after the poling treatment as in Working Example 1.

As shown in FIG. 4B, a rhombohedral peak (Rhomb. 200) was observed between a tetragonal peak near 43.5° (Tetra. 002) and a tetragonal peak near 45° (Tetra. 200). This result confirmed that the results of the EDX compositional analysis corresponded to a mixture of tetragonal crystals and rhombohedral crystals in the piezoelectric particle 14.

Furthermore, from this XRD pattern near 44°, the full width at half maximum (200) (a measure of crystallinity) was found to be 0.28.

Furthermore, in the same manner as in Working Example 1, an aluminum electrode was formed and the piezoelectric properties of the piezoelectric composite 10 were evaluated.

The piezoelectric constant $d_{33}$ of the piezoelectric composite 10 was 83 pC/N.

The results of the measurements above are also shown in the table below.

Working Example 3

Piezoelectric particles 14 were produced in the same manner as in Working Example 1 except that the raw material particles were crushed for 1 hour in a ball mill prior to being crushed with a mesh. In other words, in the present example the raw material particles were first crushed for 1 hour in a ball mill and then crushed using a mesh.

The particle size distribution and specific surface area of the resulting piezoelectric particles 14 were measured in the same manner as in Working Example 1. The median diameter ($D_{50}$) was 2.3 μm. The ratio of particles less than or equal to 1 μm ($V_{<1\,\mu m}$) was 11.2 vol %. The ratio of particles greater than or equal to 10 μm ($V_{>10\,\mu m}$) was 0.0 vol %. The specific surface area was 0.614 m$^2$/g.

Furthermore, in the same manner as in Working Example 1, the compositions of five of the piezoelectric particles 14 that were selected at random were tested at approximately 10 locations per particle using EDX. All of the tested particles exhibited values of x in general formula I ranging from 0.3-0.7 as well as mixtures of regions having respectively different values of x.

Next, in the same manner as in Working Example 1, a piezoelectric composite 10 was formed on an aluminum sheet, and a poling treatment was performed.

Figure 4C:
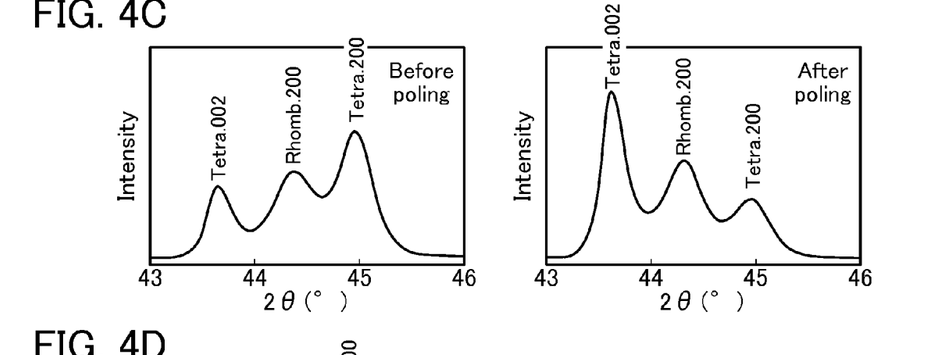

FIG. 4C shows the XRD patterns near 44° of the piezoelectric particles 14 as measured before and after the poling treatment in the same manner as in Working Example 1.

As shown in FIG. 4C, a rhombohedral peak (Rhomb. 200) was observed between a tetragonal peak near 43.5° (Tetra. 002) and a tetragonal peak near 45° (Tetra. 200). This result confirmed that the results of the EDX compositional analysis corresponded to a mixture of tetragonal crystals and rhombohedral crystals in the piezoelectric particle 14.

Furthermore, from this XRD pattern near 44°, the full width at half maximum (200) (a measure of crystallinity) was found to be 0.29.

Furthermore, in the same manner as in Working Example 1, an aluminum electrode was formed and the piezoelectric properties of the piezoelectric composite 10 were evaluated.

The piezoelectric constant $d_{33}$ of the piezoelectric composite 10 was 72 pC/N.

The results of the measurements above are also shown in the table below.

Comparative Example

The raw material powder mixture same as Working Example 1 was crushed for 12 hours in a ball mill.

Next, the mixture was molded into a cylinder shape with a diameter of 25 mm and a thickness of 5 mm using a uniaxial compression mold and a compression force of 100 MPa. This molding was sintered for 3 hours at 1100° C. to obtain a dense sintered compact.

This sintered compact was wet-crushed for 48 hours in a ball mill to obtain powder having an average particle diameter of about 1 μm. This powder was then sintered again at 1000° C.

Furthermore, the resulting particles were then crushed using a mesh in the same manner as in Working Example 1 to produce PZT particles (PZT sintered compact particles).

The particle size distribution and specific surface area of the resulting PZT particles were measured in the same manner as in Working Example 1. The median diameter ($D_{50}$) was 7.8 μm. The ratio of particles less than or equal to 1 μm ($V_{<1\,\mu m}$) was 3.7 vol %. The ratio of particles greater than or equal to 10 μm ($V_{>10\,\mu m}$) was 36.2 vol %. The specific surface area was 0.310 m$^2$/g.

Figure 3B:
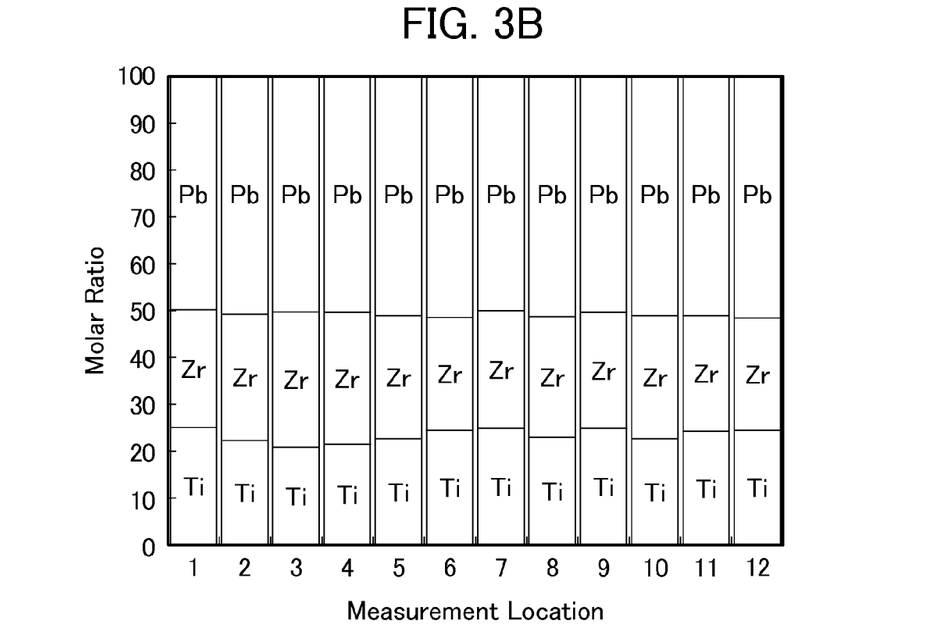
FIG. 3B is a graph showing the composition of a PZT sintered compact.

Furthermore, in the same manner as in Working Example 1, the compositions of five of the PZT particles that were selected at random were tested at approximately 10 locations per particle. All of the particles had values of x in general formula I of approximately 0.52 at all of the measurement locations.

FIG. 3B shows the composition of one of the particles selected at random. Note that the horizontal axis is numbered by arbitrarily set measurement locations on the particle.

Next, in the same manner as in Working Example 1, a piezoelectric polymer composite material using these PZT particles was formed on an aluminum sheet, and a poling treatment was performed.

Figure 4D:
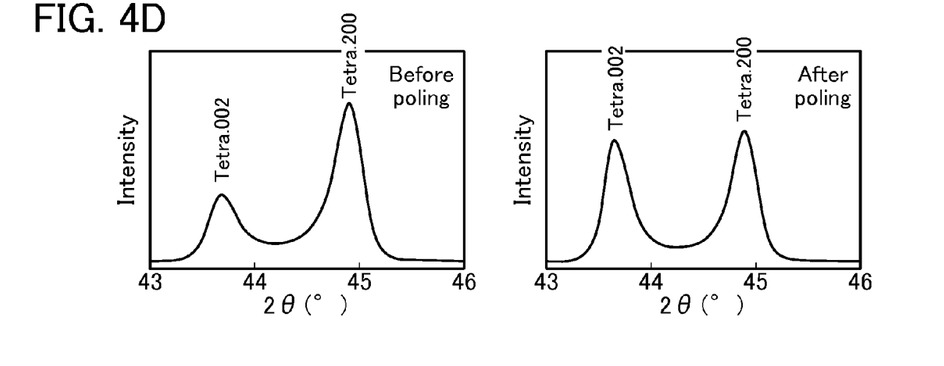

FIG. 4D shows the XRD patterns near 44° of the PZT particles as measured before and after the poling treatment in the same manner as in Working Example 1.

As shown in FIG. 4D, in the XRD patterns of these PZT particles, only a tetragonal peak near 43.5° (Tetra. 002) and a tetragonal peak near 45° (Tetra. 200) were observed. No rhombohedral peak (Rhomb. 200) was observed. This result confirms that these PZT particles contained only tetragonal crystals.

Furthermore, from this XRD pattern near 44°, the full width at half maximum (200) (a measure of crystallinity) was found to be 0.24. Therefore, these PZT particles exhibit a higher degree of crystallinity than any of the piezoelectric particles 14 in Working Examples 1 to 3.

Furthermore, in the same manner as in Working Example 1, an aluminum electrode was formed and the piezoelectric properties of the piezoelectric polymer composite material were evaluated.

The piezoelectric constant $d_{33}$ of the piezoelectric polymer composite material was 67 pC/N.

The results of the measurements above are also shown in the table below.

particles less than or equal to 1 μm in particle size. This result indicates that the difference in piezoelectric properties among Working Examples 1 to 3 is likely due to the ratio of particles greater than or equal to 10 μm in particle size.

Figure 5:
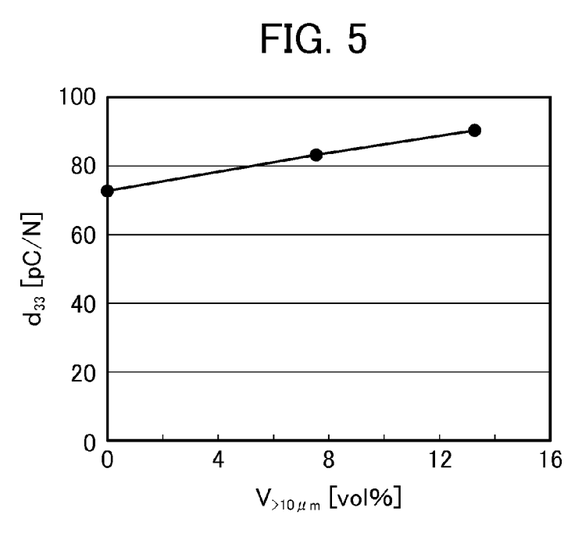
FIG. 5 is a graph showing the relationship between the ratio of particles greater than or equal to 10 μm and the resulting piezoelectric properties.

Therefore, the relationship between the ratio of particles greater than or equal to 10 μm in particle size ($V_{>10\ \mu m}$) and the resulting piezoelectric constant ($d_{33}$) was plotted, as shown in FIG. 5. FIG. 5 shows that when 5 vol % or more of the piezoelectric particles 14 have a particle size of greater than or equal to 10 μm, a high piezoelectric constant of greater than or equal to 80 pC/N is achieved.

From the results described above, the effect of the present invention is clearly shown.

What is claimed is:

1. A piezoelectric polymer composite material comprising piezoelectric particles dispersed in a matrix made from a polymer material,
    the piezoelectric particles being composed primarily of lead zirconate titanate having a general formula of $Pb(Zr_xTi_{1-x})O_3$ and each of the piezoelectric particles containing a mixture of tetragonal crystals and rhombohedral crystals.

2. The piezoelectric polymer composite material according to claim 1, wherein each of the piezoelectric particles contains a mixture of regions having respectively different values of x ranging from 0.3-0.7 in the general formula when

TABLE 1

|  | Median Diameter (D50) [μm] | V < 1 μm [vol %] | V > 10 μm [vol %] | FWHM | Specific Surface Area [m2/g] | Piezoelectric Constant (d33) [pC/N] |
|---|---|---|---|---|---|---|
| Raw Material Powder | 4.2 | 5.9 | 22.0 | 0.27 | 0.410 | — |
| Working Example 1 | 3.4 | 7.0 | 13.3 | 0.28 | 0.496 | 90 |
| Working Example 2 | 3.0 | 9.2 | 7.6 | 0.28 | 0.511 | 83 |
| Working Example 3 | 2.3 | 11.2 | 0.0 | 0.29 | 0.614 | 72 |
| Comparative Example | 7.8 | 3.7 | 36.2 | 0.24 | 0.310 | 67 |

As shown above, the piezoelectric composites 10 of the present invention that use piezoelectric particles 14 in which each particle contains a mixture of tetragonal crystals and rhombohedral crystals exhibited higher piezoelectric properties than a conventional piezoelectric polymer composite material (the comparative example) that uses PZT sintered compact that only contains tetragonal crystals as piezoelectric particles, regardless of the fact that the piezoelectric particles 14 exhibit a lower overall degree of crystallinity.

Moreover, as shown in FIGS. 4A to 4C, the heights of the tetragonal peak near 43.5° (Tetra. 002) and the tetragonal peak near 45° (Tetra. 200) of the piezoelectric particles 14 are reversed before and after the poling treatment in each of the piezoelectric composites 10 of the present invention. This result indicates that tetragonal PZT tends to exhibit more 90° domain wall motion. Materials that tend to exhibit more 90° domain wall motion also exhibit high piezoelectric properties. This fact also makes it clear that the piezoelectric composite 10 of the present invention has high piezoelectric properties.

Meanwhile, the only difference among Working Examples 1 to 3 was the method used to crush the raw material powder. Table 1 shows that this difference has essentially no impact on crystallinity. Furthermore, the crushing time had essentially no impact on the ratio of a composition of the piezoelectric particles is analyzed using energy dispersive X-ray spectrometry.

3. The piezoelectric polymer composite material according to claim 1, wherein an average value of x in the general formula for all of the piezoelectric particles is 0.52±0.10.

4. The piezoelectric polymer composite material according to claim 1, wherein each of the piezoelectric particles contains a mixture of regions having a value of x in the general formula is +0.1 or more relative to an average value of x of all of the piezoelectric particles as well as regions having a value of x is −0.1 or less relative to the average value of x of all of the piezoelectric particles when a composition of the piezoelectric particles is analyzed using energy dispersive X-ray spectrometry.

5. The piezoelectric polymer composite material according to claim 1, wherein when particle sizes of the piezoelectric particles are measured using a laser diffraction particle size measurement device, a median diameter ($D_{50}$) is 2-5 μm.

6. The piezoelectric polymer composite material according to claim 1, wherein when particle sizes of the piezoelectric particles are measured using a laser diffraction particle size measurement device, a ratio of the piezoelectric particles greater than or equal to 10 μm in particle size is 5-30 vol % of all of the piezoelectric particles.

7. The piezoelectric polymer composite material according to claim 1, wherein when particle sizes of the piezoelectric particles are measured using a laser diffraction particle size measurement device, a ratio of the piezoelectric particles less than or equal to 1 μm in particle size is less than or equal to 10 vol % of all of the piezoelectric particles.

8. The piezoelectric polymer composite material according to claim 1, wherein the matrix is made from a polymer material that exhibits viscoelasticity at normal temperatures.

* * * * *